United States Patent [19]

Campbell

[11] 4,242,732
[45] Dec. 30, 1980

[54] COMMUTATING NARROWBAND FILTER

[75] Inventor: Kenneth J. Campbell, Solana Beach, Calif.

[73] Assignee: The United States of America as represented by the Secretary of the Navy, Washington, D.C.

[21] Appl. No.: 9,206

[22] Filed: Feb. 5, 1979

[51] Int. Cl.³ .............................................. G06F 15/31
[52] U.S. Cl. .................................. 364/485; 364/572; 364/726
[58] Field of Search ............... 364/485, 572, 724, 726

[56] References Cited

U.S. PATENT DOCUMENTS

| 3,881,097 | 4/1975 | Lehmann et al. | 364/726 |
| 3,935,437 | 1/1976 | Schmitt et al. | 364/572 X |
| 4,093,988 | 6/1978 | Scott | 364/726 X |
| 4,093,989 | 6/1978 | Flink et al. | 364/572 X |
| 4,131,766 | 12/1978 | Narasimha | 364/726 X |
| 4,138,730 | 2/1979 | Ali | 364/726 |

Primary Examiner—Edward J. Wise
Attorney, Agent, or Firm—Richard S. Sciascia; Ervin F. Johnston; Thomas M. Phillips

[57] ABSTRACT

A signal to be filtered is applied to a commutating filter which is controlled by a tunable oscillator tuned to a desired filter frequency. The commutating filter includes a plurality of RC networks to which the input signal is sequentially connected. The output of the commutating filter is a series of discrete voltages from the capacitor sections and of the RC networks which are fed to an analog to digital converter. The resulting digital words produced by the converter are stored in a microprocessor and used to compute the spectral content of the input signal by means of the Discrete Fourier Transform. The computed output from the microprocessor represents the effect of the cascaded filter sections of the system.

5 Claims, 8 Drawing Figures

COMMUTATING NARROWBAND FILTER

BACKGROUND OF THE INVENTION

The present invention relates to narrowband filters and more particular to narrowband filters suited for use in a system where a digital word describing characteristics of the filtered signal is desired. Present analog filtering techniques utilize both active and passive components to yield continuous time filtering. The signal output from the filter is then detected by suitable means to yield magnitude information. This magnitude information is then converted to a digital word by means of an analog to digital converter. Such filters do not have high center frequency stability necessary in high Q applications. Present digital filtering techniques employ signal sampling coupled with numerical computation capability like that found in minicomputers to yield information concerning spectral content. Such techniques require high timing accuracy and high computational speed in the processor which leads, consequently, to complex systems.

SUMMARY OF THE INVENTION

The present invention provides for a narrowband filter comprising a high Q analog section and a digital processing section that overcomes the disadvantages of prior known narrowband filtering techniques. A first filter section consisting of a commutating filter performs time-sampling of an input signal. A following digital section applies the Discrete Fourier Transform to the time samples to yield a digital word describing the spectral content of the input signal.

The signal to be filtered is commutated to a plurality of RC networks comprising a commutating filter. The rate of commutation is selectable; it is controlled by a variable frequency source comprising a tunable oscillator. The selected commutation rate provided by the variable frequency source constitutes the desired filter frequency.

The output of the commutating filter is a series of discrete voltages taken sequentially from the RC networks. The output may also be viewed as a time-sampled, partially filtered version of the input signal. The voltages are sequentially applied to an analog to digital converter and the resulting digital words produced by the converter are stored in the microprocessor for use in computation of the spectral content of the input signal. Computation of spectral content is accomplished by means of the Discrete Fourier Transform. The digital word output from the microprocessor then represents the combined filtering function of the two cascaded filter sections.

OBJECTS OF THE INVENTION

An object of the invention is the provision of a narrowband filter having a digital output.

Another object of the invention is the provision of a narrowband filter which provides a simple implementation of narrowband filtering by taking advantage of the computational capability of a microprocessor without requiring the high speed necessary in full digital filtering.

A further object of the invention is the provision of a narrowband filter wherein the tuning of the center frequency of the filter depends only upon the tuning frequency applied to a commutating filter section.

Other objects and many of the attendant advantages of this invention will be readily appreciated as the same becomes better understood by reference to the following detailed description when considered in connection with the accompanying drawings.

DESCRIPTION OF THE PREFERRED EMBODIMENTS

Figure 1:
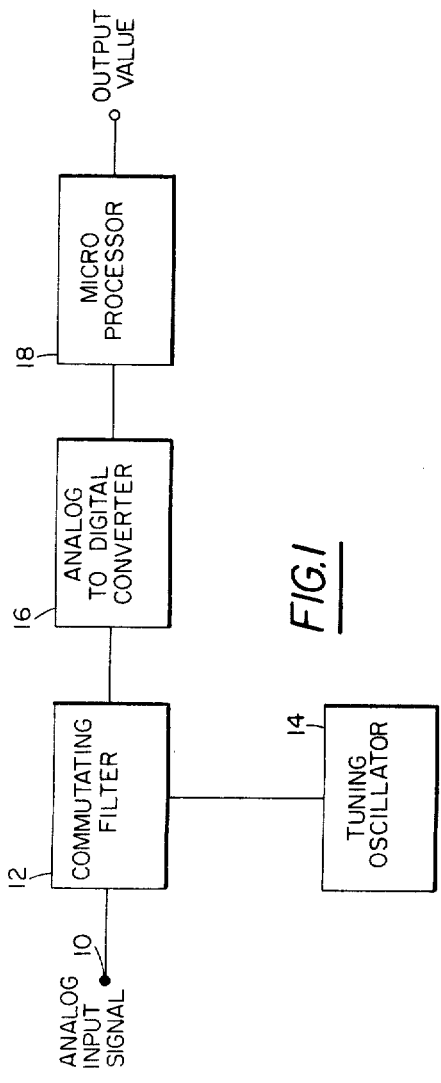
FIG. 1 is a block diagram of the preferred embodiment of the invention.

Referring now to the drawings, there is shown in block diagram form in FIG. 1 an input analog signal at input terminal 10 which is applied to the input of commutating filter 12. A tunable oscillator 14 is connected to commutating filter 12 and is tuned to the desired filter frequency. Commutating filter 12, which is a plurality of RC networks sequentially connected to the input signal, reaches a condition of equilibrium after a time related to the filter time-bandwidth product. A typical frequency response characteristic of a commutating filter shown in FIG. 4. Commutating filters are well known in the art and reference may be had to Feller, D. W., "Design CMOS Commutative Filters," Electronic Design, No. 23, Nov. 8, 1974, pp. 116-120.

Figure 4:
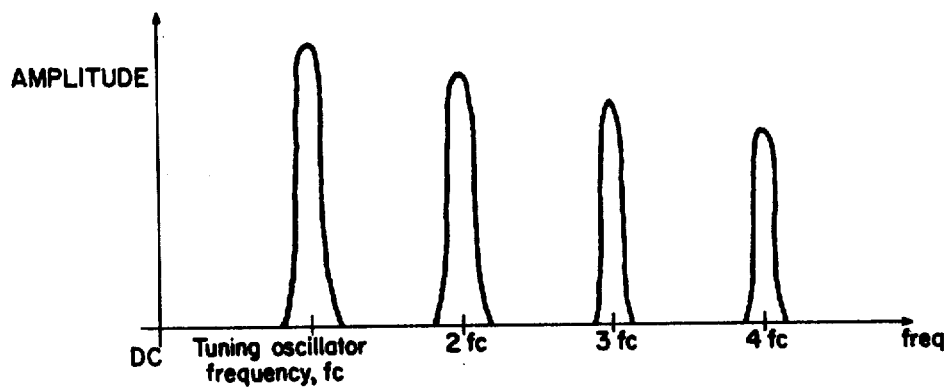
FIG. 4 is a graph showing the typical frequency response of a commutating filter.
Figure 5:
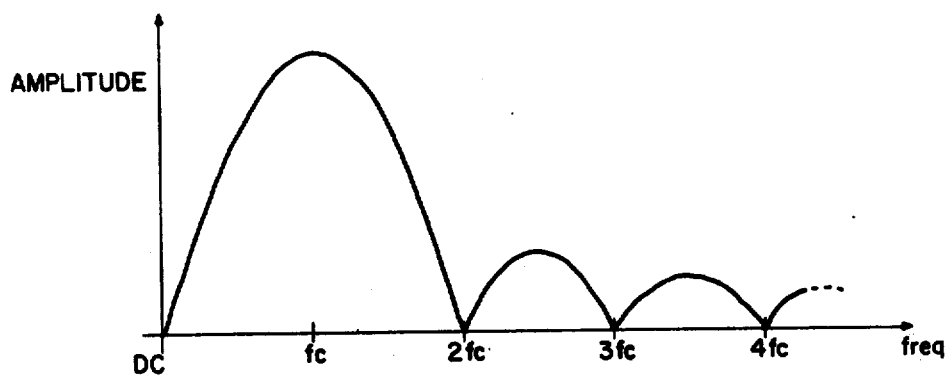
FIG. 5 is a graph showing the typical frequency response of the Discrete Fourier Transform.
Figure 6:
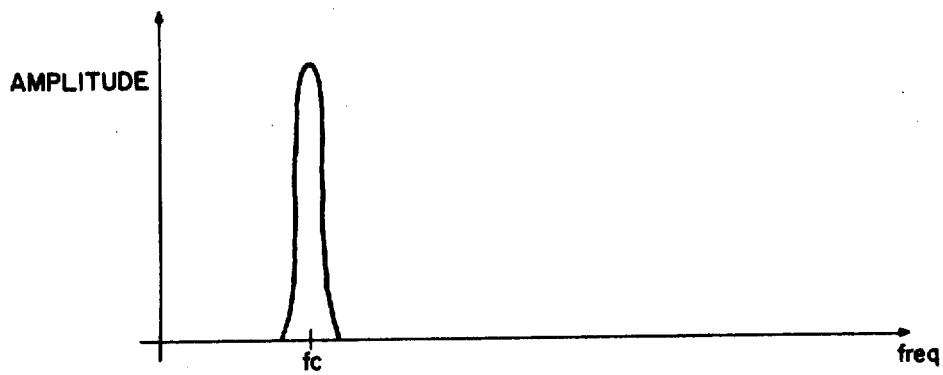
FIG. 6 is a graph showing the typical frequency response of the embodiment of FIG. 1.

The output of commutating filter 12 is a series of discrete voltages taken from the various capacitor sections. This output may also be viewed as a partially filtered, time-sampled version of the input signal. In the preferred embodiment, the output signal from commutating filter 12 consists of eight circuit voltages which are sequentially applied to analog to digital converter 16; the resulting digital words are stored in microprocessor 18 for digital filtering therein to derive the spectral content of the input signal around a selected frequency. Digital filtration is effected by computation using the Discrete Fourier Transform. The frequency response of such a digital filter is shown in FIG. 5. The output of microprocessor 18 is then one digital word representing the cascading of the filtering functions of the two above described filters. The frequency response of the total filtering system is shown in FIG. 6. As shown in FIG. 4 the output response from commutating filter 12 is a series of pulses of decreasing maximum amplitudes which occur at $f_c$, $2f_c$, $3f_c$, etc., where $f_c$ is the commutating frequency. In FIG. 5 the amplitude of the first pulse is at $f_c$ with zero amplitudes occurring at $2f_c$, $3f_c$, $4f_c$, etc. When these two filtering functions are multiplied together the waveform of FIG. 6 results, which is a very narrow passband centered on the frequency $f_c$.

Figure 2B:
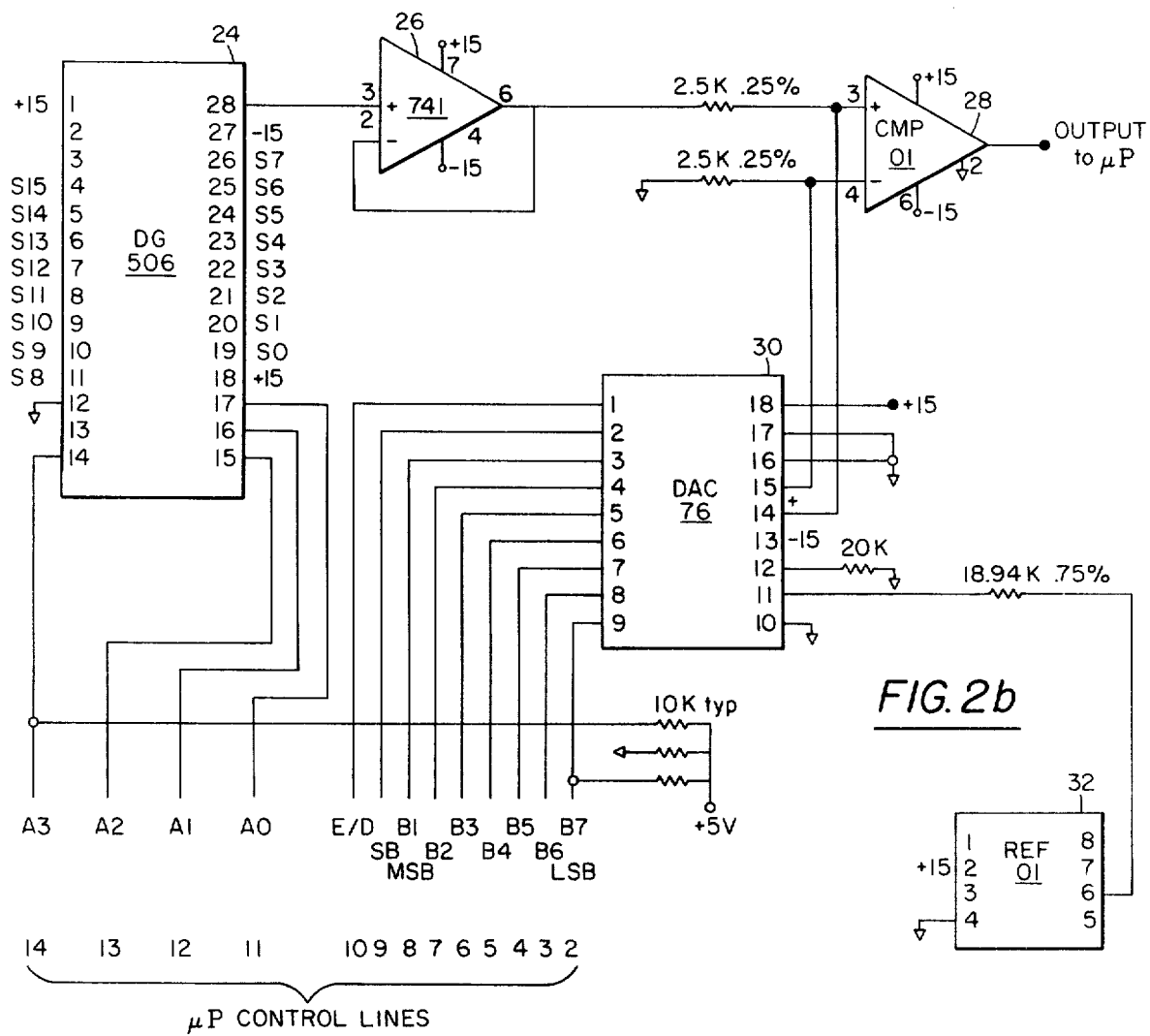
FIGS. 2a and 2b are schematic diagrams of elements contained in the embodiment of FIG. 1.
Figure 2A:
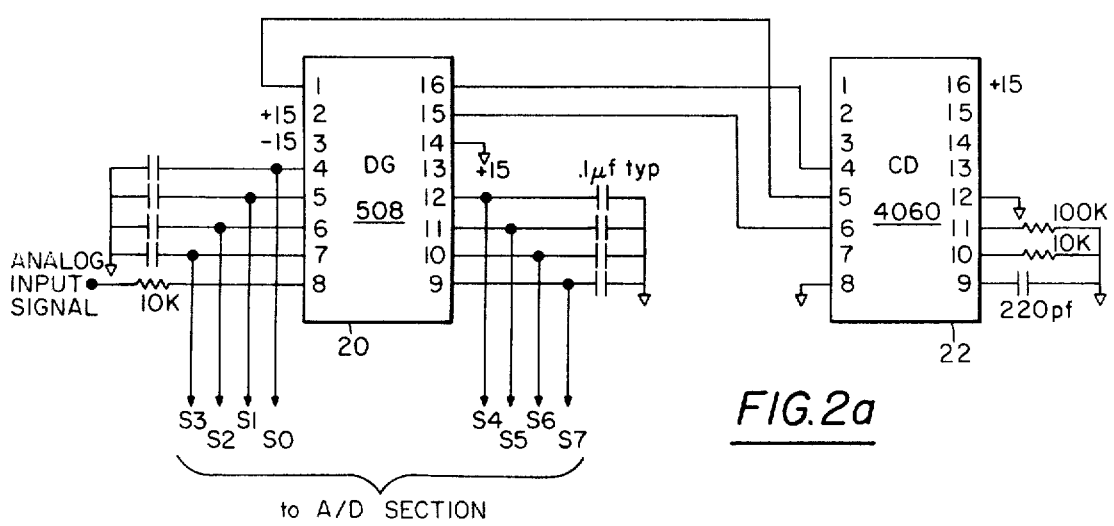

Referring to FIG. 2a, a schematic diagram of commutating filter 12, and FIG. 2b, a schematic diagram of analog to digital converter 15, an analog input signal is applied to terminal 8 of a multiplexer 20 which may be a DG508 manufactured by Siliconix. The input signal is sequentially applied to each of the capacitors connected to terminals 4–7 and 9–12; a plurality of output signals are produced at terminals S0–S7. Multiplexer 20 is controlled by oscillator/counter 22 which may be a CD4060 manufactured by Motorola. Outputs 4, 5, and 6 of counter 22 are connected to terminals, 1, 16, and 15, respectively, of multiplexer 20. The sample signals appearing at the outputs S0–S7 from multiplexer 20 are connected to the inputs S0–S7 of multiplexer 24 which may be a DG506 manufactured by Siliconix. As shown, all of the terminals of multiplexer 24 are not utilized in this application.

The output (terminal 28) from multiplexer 24 is fed to the positive input terminal of unity gain buffer amplifier 26. The output from buffer 26 is fed to the noninverting input of comparator 28. The output from terminals 14 and 15 of digital to analog converter (DAC) 30 are also applied to the noninverting and inverting inputs, respectively, of comparator 28. The output from comparator 28 is the input for the microprocessor. A precision reference source 32 provides the reference voltage for DAC 30. Reference voltage source 32, DAC 30, and comparator 28 each may be of an equivalent type manufactured by Precision Monolithics, Incorporated. The output from multiplexer 24 is converted to digital form using the well known successive approximation technique which is controlled from the microprocessor control lines 2–14 as shown.

Figure 3:
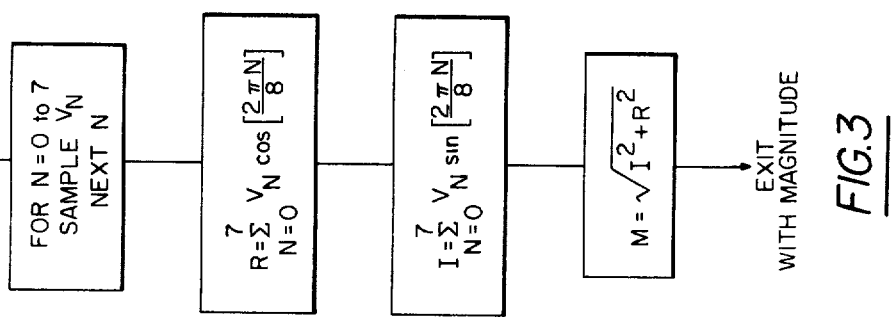
FIG. 3 is the program flow diagram of the microprocessor used in the embodiment of FIG. 1 for computing the magnitude of the 1 kHz component of an input signal.

Computation of the spectral content of the digital word input is shown by way of example in FIG. 3 which is a program flow chart for computing the magnitude of the one kHz component. $V_N$, $N=0-7$, is the series of discrete voltages taken from commutating filter 12. R and I represent the real and imaginary parts, respectively, of the one kHz spectral component.

Figure 7:
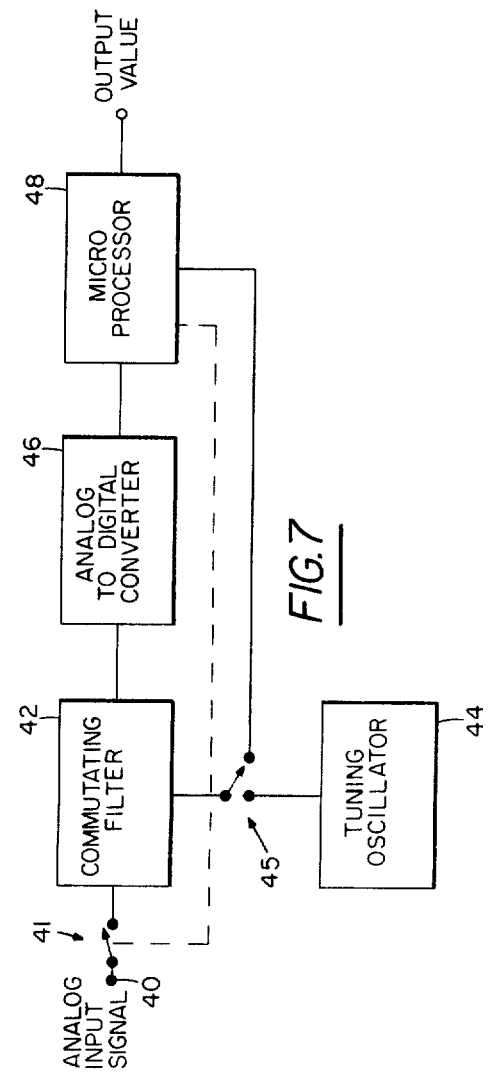
FIG. 7 is a modification of the embodiment of FIG. 1.

In the embodiment of FIG. 7, the input signal at input terminal 40 is fed through an isolation switch 41 to commutating filter 42. Tuning oscillator 44 is coupled through a source selector switch 45 to commutator filter 42. The output from commutator filter 42 is sequentially fed to analog to digital converter 46 which provides digital input to microprocessor 48.

In operation, isolation switch 41 is first opened to hold the voltage level in commutating filter 42. This operation may be programmed to be performed by microprocessor 48. Simultaneously, source selector 45 in response to microprocessor 48 transfers control of the commutating filter 42 to microprocessor 48. Through microprocessor control of the commutating element, each capacitor voltage is sequentially applied to the analog to digital converter 46 and the resulting digital words are stored in microprocessor 48 for use in computation of spectral content. Computation of spectral content is accomplished in the same manner as the embodiment of FIG. 1.

Obviously, many other modifications and variations of the present invention are possible in the light of the above teachings. It is therefore to be understood that within the scope of the appended claims the invention may be practiced otherwise than as specifically described.

What is claimed is:

1. A narrowband filter having a digital output, comprising:
    a commutating filter means having a plurality of filter sections to which an input analog signal to be filtered is commutated at a commutation frequency, the output of the commutating filter means comprising a series of discrete voltages taken sequentially from the filter sections; and
    a second filter means connected to the commutating filter means for combining the discrete voltages to compute the spectral content of the input signal by use of a Discrete Fourier Transform and for providing a digital output representing the spectral content of the input signal in a frequency band centered on the commutation frequency.

2. The narrowband filter of claim 1 wherein each filter section comprises an RC network.

3. The narrowband filter of claim 2 further including sequential switching means for sequentially connecting each of the RC networks to the output of the commutating filter, whereby the commutating frequency is determined by the switching rate of the sequential switching means.

4. A narrowband filter having a digital output, comprising:
    a commutating filter means which includes a plurality of RC networks to which an input analog signal to be filtered is commutated at a commutation frequency, having a first input for receiving the input signal, a second input, and an output for providing a series of discrete voltages taken sequentially from the RC networks;
    a variable frequency means connected to the second input of the commutating filter for selecting the commutation frequency;
    an analog to digital conversion means having an input connected to the output of the commutating filter and having an output for converting said series of discrete voltages into a series of digital words; and
    a processing means having an input connected to the output of the conversion means and having an output for processing the digital words by use of a Discrete Fourier Transform to compute the spectral content of the input signal at the selected commutation frequency, and for providing a digital representation of the spectral content of the input signal in a frequency band centered on the commutation frequency.

5. The narrowband filter of claim 4 further including:
    first switching means connected between a source of the input signal and the commutating filter means, the first switching means also connected to the processing means and responsive thereto for opening to disconnect the input signal source; and
    second switching means connected between the variable frequency means and the commutating filter means, the second switching means also connected to the processing means and responsive thereto for switching control of commutation speed from the variable frequency means to the processing means;
    whereby values of portions of the input signal will be held on the respective RC networks to which they were commutated and will be applied to the conversion means at a rate controlled by the processing means.

* * * * *